United States Patent

(12) United States Patent
Goto

(10) Patent No.: US 9,209,212 B2
(45) Date of Patent: Dec. 8, 2015

(54) IMAGE SENSOR INCLUDING SOURCE FOLLOWER

(71) Applicant: Samsung Electronics Co., Ltd., Suwon-si, Gyeonggi-do (KR)

(72) Inventor: Hirosige Goto, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 14/459,385

(22) Filed: Aug. 14, 2014

(65) Prior Publication Data

US 2015/0048426 A1    Feb. 19, 2015

(30) Foreign Application Priority Data

Aug. 16, 2013  (KR) .................. 10-2013-0097320

(51) Int. Cl.
*H01L 27/146*    (2006.01)
*H01L 27/148*    (2006.01)
*H04N 5/369*     (2011.01)

(52) U.S. Cl.
CPC ...... *H01L 27/14616* (2013.01); *H01L 27/1463* (2013.01); *H01L 27/14612* (2013.01); *H04N 5/3698* (2013.01)

(58) Field of Classification Search
CPC .............. H01L 27/1463; H01L 27/14616; H01L 29/0642
See application file for complete search history.

(56) References Cited

U.S. PATENT DOCUMENTS

| | | | |
|---|---|---|---|
| 6,909,143 B2 | 6/2005 | Jeon et al. | |
| 7,718,498 B2 | 5/2010 | Itonaga | |
| 7,816,734 B2 * | 10/2010 | Jung et al. | 257/345 |
| 8,068,157 B2 | 11/2011 | Jung et al. | |
| 8,072,015 B2 | 12/2011 | Itonaga | |
| 2005/0128326 A1 * | 6/2005 | Korthout et al. | 348/308 |
| 2008/0079043 A1 | 4/2008 | Kim et al. | |
| 2008/0211940 A1 | 9/2008 | Hynecek | |
| 2011/0242388 A1 | 10/2011 | Watanabe et al. | |
| 2012/0025307 A1 * | 2/2012 | Komatsu et al. | 257/335 |
| 2012/0080733 A1 | 4/2012 | Doan et al. | |
| 2012/0307117 A1 | 12/2012 | Sato et al. | |
| 2014/0042506 A1 * | 2/2014 | Ramberg et al. | 257/292 |

FOREIGN PATENT DOCUMENTS

| | | |
|---|---|---|
| JP | 2011-205037 | 10/2011 |
| KR | 1020050121441 | 12/2005 |
| KR | 1020090072290 | 7/2009 |

* cited by examiner

*Primary Examiner* — Erik Kielin
(74) *Attorney, Agent, or Firm* — EIPG, PLLC

(57) ABSTRACT

Provided is an image sensor including a source follower transistor. The source follower transistor may include a channel structure that is provided between a source and a drain, and includes a first semiconductor layer, a second semiconductor layer, and a blocking structure. The first semiconductor layer may be spaced apart from a gate insulating layer of the source follower transistor by a first depth or more. Carriers may move from the source of the source follower transistor to the drain thereof through the first semiconductor layer.

10 Claims, 15 Drawing Sheets

IMAGE SENSOR INCLUDING SOURCE FOLLOWER

CROSS-REFERENCE TO RELATED APPLICATIONS

This application claims the benefit of priority under 35 U.S.C. §119 from Korean Patent Application No. 10-2013-0097320, filed on Aug. 16, 2013, in the Korean Intellectual Property Office, the disclosure of which is incorporated herein in its entirety by reference.

BACKGROUND

1. Field

The present general inventive concept relates to an image sensor including a source follower, and more particularly, to an image sensor including a source follower transistor having a gate to which a voltage that is dependent on charges accumulated in a photo detecting device is applied.

2. Description of the Related Art

Image sensors capture a subject and convert the subject into electric signals. Image sensors are not only used in general consumer electronic devices, such as digital cameras, mobile phone cameras, and mobile camcorders, but also in cameras installed in automobiles, security devices, and robots. Image sensors may include a pixel array. Light from the subject may be incident onto the pixel array via a module lens. The pixel array may include a plurality of pixels, and each of the plurality of pixels includes a photo detecting device. The photo detecting device may generate electric signals according to the intensity of absorbed light. For example, a photo diode may absorb light and thus generate a current.

The pixel may include a circuit for processing the electric signals generated by the photo detecting device. For example, the pixel may include at least one transistor. The at least one transistor may be controlled by applying a voltage, which depends on signals that are received from outside the pixel array, to a gate of the transistor. Also, the at least one transistor may amplify the electric signals generated by the photo detecting device. For example, a source follower transistor may output voltages, which depend on the voltage applied to the gate, through a source of the transistor. If errors of the voltages that are output by the source follower transistor are reduced, the signals that are output by the image sensors may more accurately reflect the intensity of the light that is absorbed by the photo detecting device. In addition, if the source follower transistor consumes less power, the image sensors may also consume less power.

SUMMARY

The present general inventive concept provides an image sensor including a source follower having reduced errors of voltages that are output by the source follower, and consuming less power.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing an image sensor including a source follower having a gate to which a voltage dependent on charges accumulated in a photo detecting device is applied, a gate insulating layer formed under the gate, a source and a drain, which are a first conductive type, a first semiconductor layer that is the first conductive type, having ends connected to the source and the drain, and in which a channel through which carriers move from the source to the drain is formed, and a second semiconductor layer, that is a second conductive type that is different from the first conductive type, and is formed between the gate insulating layer and the first semiconductor layer.

The source follower transistor may further include a blocking structure that blocks the carriers from moving between the source and the second semiconductor layer.

The blocking structure may be a shallow trench isolation (STI) that is formed between the source and the second semiconductor layer, and the STI may include an insulating material.

The blocking structure may be formed between the source and the second semiconductor layer, and is the second conductive type, and a second conductive type impurity concentration of the blocking structure may be higher than a second conductive type impurity concentration of the second conductive layer.

The source follower transistor may further include a pass-through region that is the first conductive type, and is formed in the first semiconductor layer under the blocking structure, and a first conductive type impurity concentration of the pass-through region may be higher than a first conductive type impurity concentration of the first semiconductor layer.

The image sensor may further include a body that is the second conductive type, and a surface of the first semiconductor layer may form a first PN junction with the second semiconductor layer, and another surface of the first semiconductor layer may form a second PN junction with the body.

The first semiconductor layer may have a first conductive type carrier concentration that allows the first semiconductor layer to be fully depleted by the first and second PN junctions, and the second semiconductor layer may have a second conductive type carrier concentration that allows the second semiconductor layer to be fully depleted by the first PN junction.

The first conductive type may be n-type, and the second conductive type may be p-type.

The image sensor may further include a voltage supply circuit applying a first voltage to the drain so that the voltage between the gate and the drain is lower than a threshold voltage of the source follower transistor.

The first voltage may be a direct current (DC) voltage.

The present general inventive concept may also be achieved by providing an image sensor including a gate to which a voltage dependent on charges accumulated in a photo detecting device is applied, a gate insulating layer formed under the gate, a source and a drain, which are a first conductive type, and a channel structure of having ends connected to the source and the drain, and which contacts the gate insulating layer. Carriers may move from the source to the drain through a channel that is formed in a portion of the channel structure that is spaced apart from the gate insulating layer by a first depth or more.

The channel structure may include a first semiconductor layer that is the first conductive type, having ends connected to the source and the drain, and a second semiconductor layer, that is a second conductive type that is different from the first conductive type, and may be formed between the gate insulating layer and the first semiconductor layer. The carriers may move from the source to the drain through the first semiconductor layer.

The channel structure may further include a blocking structure that blocks the carriers from moving between the source and the second semiconductor layer.

A voltage supply circuit applying a first voltage to the drain so that the voltage between the gate and the drain is lower than a threshold voltage of the source follower transistor may be further included.

The image sensor may further include a pixel array including a plurality of pixels. Each of the plurality of pixels may include the source follower transistor; the drain of the source follower transistor included in each of the plurality of pixels may be wired to each other; and the first voltage may be a DC voltage.

The present general inventive concept may be also achieved by providing a method of manufacturing a source follower transistor to amplify a voltage of a floating diffusion node, including forming a blocking structure in a substrate, forming a first semiconductor layer in the substrate, forming a second semiconductor layer within the first semiconductor layer, forming an insulation layer on the substrate above the second semiconductor layer, forming a gate above the insulation layer and connected to the floating diffusion node, forming a source and a drain in the substrate, the source connected to one end of the first semiconductor layer and the drain connected to another end of the first semiconductor layer, such that the blocking structure is disposed between the source and the second semiconductor layer and blocks carriers from moving between the source and the second semiconductor layer, and such that a channel may be formed in the first semiconductor layer, spaced apart from the insulation layer, and through which carriers may move between the source and the drain.

The method may further include including a first conductive type impurity in the source, the drain and the first semiconductor layer, and including a second conductive type impurity in the substrate and the second semiconductor layer.

The method may further include including the second conductive type impurity in the blocking structure, such that the blocking structure includes a higher concentration of the second conductive type impurity than included in the second semiconductor layer.

Forming the blocking structure may comprise forming a shallow trench isolation (STI) and filling the STI with a dielectric layer.

The method may further include injecting boron into a shallow region of the substrate to increase a threshold voltage of the source follower transistor.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DESCRIPTION OF THE EMBODIMENTS

Figure 1:
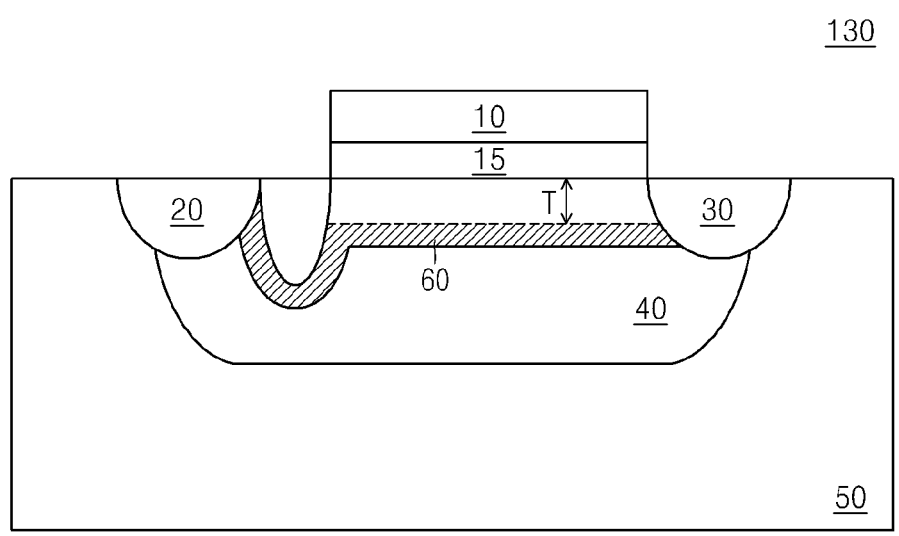
FIG. 1 is a cross-sectional view schematically illustrating a structure of a source follower transistor, according to an exemplary embodiment of the present general inventive concept.

Hereinafter, one or more embodiments of the present general inventive concept will now be described more fully with reference to the accompanying drawings, in which exemplary embodiments of the present general inventive concept are shown. The present general inventive concept may, however, be embodied in many different forms and should not be construed as being limited to the embodiments set forth herein; rather, these embodiments are provided so that this disclosure will be thorough and complete, and will fully convey the concept of the present general inventive concept to those of ordinary skill in the art. Also, throughout the specification, like reference numerals in the drawings denote like elements. Sizes of elements in the drawings may be exaggerated for convenience of explanation.

The matters defined in the description, such as detailed construction and elements, are provided to assist in a comprehensive understanding of the exemplary embodiments. Thus, it is apparent that the exemplary embodiments can be carried out without those specifically defined matters. Also, functions or elements known in the related art are not described in detail since they would obscure the exemplary embodiments with unnecessary detail.

As used herein, the singular forms "a," "an" and "the" are intended to include the plural forms as well, unless the context clearly indicates otherwise. It will be further understood that the terms "comprises" and/or "comprising" used herein specify the presence of stated features, numbers, processes, operations, elements, components, or a combination thereof, but do not preclude the presence or addition of one or more other features, numbers, processes, operations, elements, components, or a combination thereof.

Unless defined otherwise, all terms used in the description including technical or scientific terms have the same meaning as generally understood by one of ordinary skill in the art. It will be further understood that terms, such as those defined in commonly used dictionaries, should be interpreted as having a meaning that is consistent with their meaning in the context of the related art, and should not be interpreted as having ideal or excessively formal meanings unless it is clearly defined in the specification.

As used herein, the terms "source follower" and "source follower transistor" have the same meaning. The terms "gate," "source," and "drain" of a transistor respectively correspond to the "gate region," "source region," and "drain region." Also, scales of the drawings may be exaggerated, and ratios of different portions illustrated in the drawings do not limit the spirit and scope of the present general inventive concept.

As used herein, expressions such as "at least one of," when preceding a list of elements, modify the entire list of elements and do not modify the individual elements of the list.

FIG. 1 illustrates a structure of a source follower transistor 130, according to an exemplary embodiment of the present general inventive concept. As illustrated in FIG. 1, the source follower transistor 130 includes a gate 10, a gate insulating layer 15, a source 20, a drain 30, a channel structure 40, and a body 50. The source 20 and the drain 30 may include first conductive type carriers. The gate 10 may include a conductive material, and the gate insulating layer 15 may include an insulator to insulate the gate 10 and the channel structure 40. The body 50 may include second conductive type carriers, and a ground voltage may be applied to the body 50.

Based on a voltage that is applied to the gate 10 of the source follower transistor 130, a channel 60 through which carriers move may be formed from the source 20 to the drain 30. According to an exemplary embodiment of the present general inventive concept, the channel 60 may be formed in a portion of the channel structure 40 that is spaced apart from the gate insulating layer 15. For example, as illustrated in FIG. 1, the channel 60 may be formed in the portion that is spaced apart from the gate insulating layer 15 by a first depth T or more. The first depth T may be within a range of about 300 Å to about 2000 Å. Thus, the formed channel 60 may be less affected by random noise. In addition, the channel structure 40 may include a portion in which a second conductive type impurity is included in order to increase a threshold voltage of the source follower transistor 130. Accordingly, a voltage that is applied to the drain 30 of the source follower transistor 130, that is, the voltage that allows the source follower transistor 130 to operate in a saturation region, may be reduced.

Figure 2:
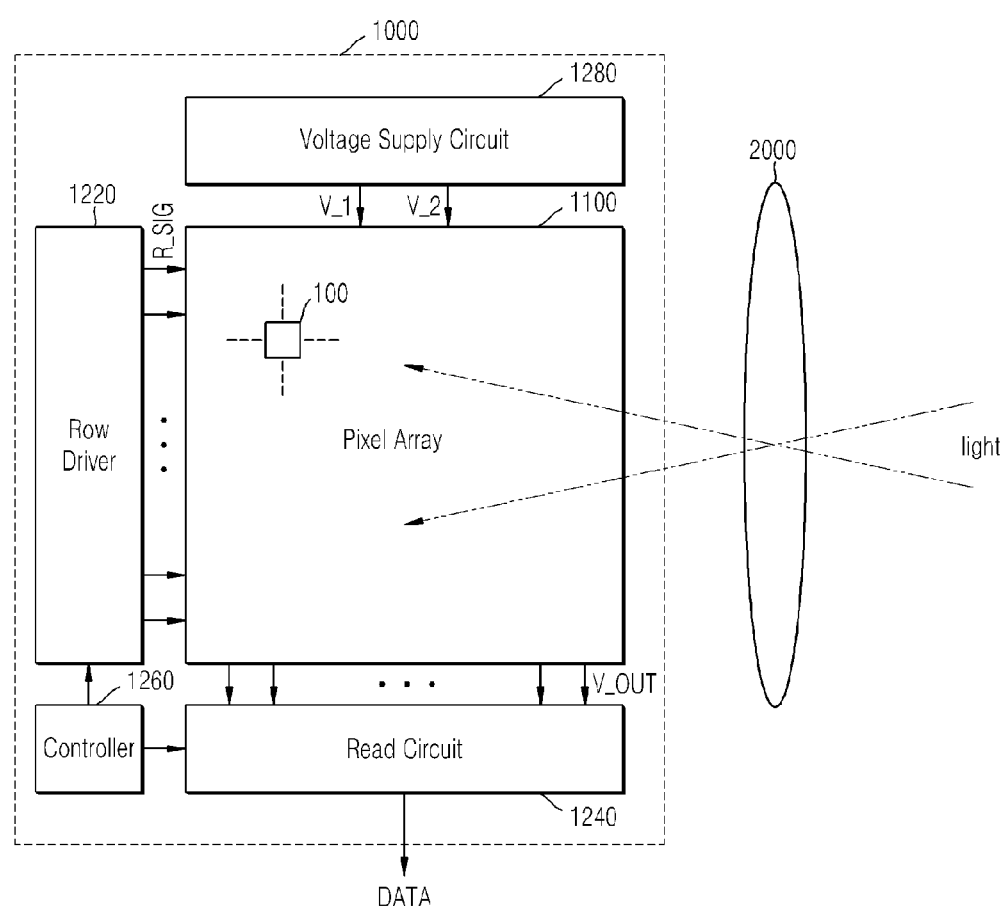
FIG. 2 is a view illustrating an image sensor, according to an exemplary embodiment of the present general inventive concept.

FIG. 2 illustrates an image sensor 1000, according to an exemplary embodiment of the present general inventive concept. As illustrated in FIG. 2, a module lens 2000 may refract light, and thus the light may be incident on the image sensor 1000. The image sensor 1000 may output data DATA according to the incident light, and the data DATA that is output may be processed into image data by using an image processor, or the like.

As illustrated in FIG. 2, the image sensor 1000 may include a pixel array 1100, a row driver 1220, a read circuit 1240, a controller 1260, and a voltage supply circuit 1280. The pixel array 1100 may include a plurality of pixels arranged in rows and columns. An exemplary pixel 100 among the plurality of pixels included in the pixel array 1100 according to the present general inventive concept may include a photo detecting device that may generate electric signals according to an intensity of absorbed light. Each of the plurality of pixels of the pixel array 1000 may further include a microlens to direct light from the module lens 1000 onto the photo detecting device. Alternatively, a lenslet array may be disposed above the pixel array 1000 to direct light from the module lens 1000 onto the photo detecting device of each pixel 100. The pixel 100 may be controlled by a row signal R_SIG that is output by the row driver 1220. For example, the pixel 100 may include at least one transistor having a gate that is connected to the row signal R_SIG. Also, the pixel 100 may include a transistor that amplifies the electric signals generated by the photo detecting device, such as the source follower transistor 130 illustrated in FIG. 1.

Pixels included in a row of the pixel array 1100 may be controlled by the same row signal R_SIG. Pixels included in a column of the pixel array 1100 may output an output voltage V_OUT through the same signal line to the outside of the pixel array 1100. For example, the pixel 100 may output signals according to the electric signals generated by the photo detecting device.

The row driver 1220 may be controlled by the controller 1260. The row driver 1220 may output the row signal R_SIG, and control each of the plurality of pixels that are included in the pixel array 1100. For example, by using the row signal R_SIG, the row driver 1220 may reset a node that the electric signal generated from the light that is absorbed by the photo detecting device of the pixel 100 is transmitted to, or may control such that the electric signals are transmitted outside of the pixel 100.

The read circuit 1240 may receive the output voltage V_OUT from the pixel array 1100, and output the data DATA according to the output voltage V_OUT. For example, the read circuit 1240 may include an analog to digital converter (ADC). The ADC may receive the output voltage V_OUT, which is an analog signal, and then output the data DATA, which is a digital signal. The controller 1260 may output at least one control signal, and may control the row driver 1220 and the read circuit 1240 by the at least one control signal.

The voltage supply circuit 1280 may supply voltages to the pixel array 1100. For example, as illustrated in FIG. 2, the voltage supply circuit 1280 may generate and supply a first voltage V_1 and a second voltage V_2 to the pixel array 1100. The first and second voltages V_1 and V_2 may be a direct current (DC) voltage, and may be applied to the transistors that are included in the plurality of pixels of the pixel array 1100. For example, V_1 and V_2 may be applied to pixel 100, as discussed below, and may further be similarly applied to any of the plurality of pixels of the pixel array 1100.

Figure 3:
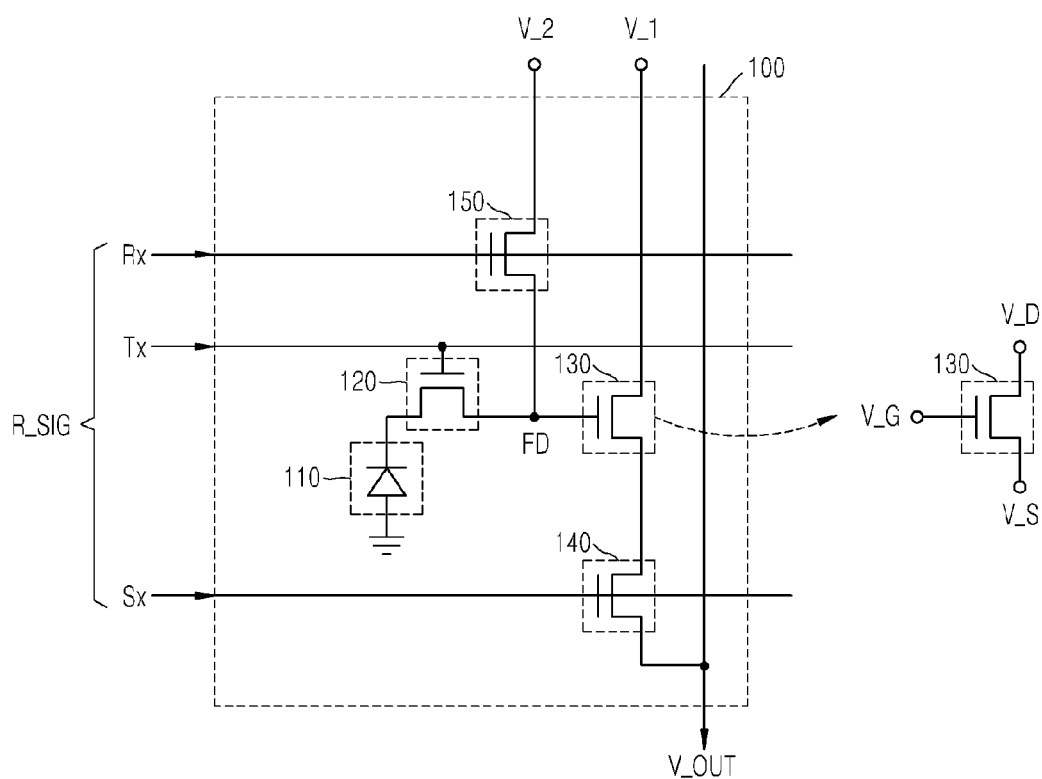
FIG. 3 is a circuit diagram illustrating a structure of a pixel, according to an exemplary embodiment of the present general inventive concept.

FIG. 3 is a circuit diagram of a structure of a pixel 100, according to an exemplary embodiment of the present general inventive concept. While the description that follows refers to pixel 100, each of the plurality of pixels of the pixel array 1100 may have a similar structure to the structure of pixel 100. Referring to FIGS. 2 and 3, the pixel 100 may be configured to be controlled by the row signal R_SIG, and thus output the output voltage V_OUT. As illustrated in FIG. 3, the pixel 100 may include a photo diode 110, a transfer transistor 120, the source follower transistor 130, a selection transistor 140, and a reset transistor 150. Also, the row signal R_SIG, which is received by the pixel 100 from the row driver 1220, may include a reset signal Rx, a transfer signal Tx, and a selection signal Sx. The transistors 120, 130, 140, and 150 included in the pixel 100 may be metal oxide semiconductor (MOS) transistors. FIG. 3 illustrates that the pixel 100 includes an NMOS transistor.

As described above, the pixel 100 may include a photo detecting device that absorbs light and thus generates electric signals, such as, for example, a photo diode, a pinned photo diode, a photo gate, or a photo transistor. Hereinafter, in the exemplary embodiments of the present general inventive concept, the photo detecting device is described as the photo diode 110, as illustrated in FIG. 3. However, the photo detecting device is not limited thereto.

According to the transfer signal Tx, the transfer transistor 120 may or may not allow the charges accumulated by the photo detecting device 110 to transmit to a floating node. The floating node, which may be, for example, a floating diffusion or a floating gate, will hereinafter be referred to as a floating diffusion FD. For example, while the photo detecting device 110 is absorbing the light and accumulating the charges, the transfer signal Tx having a voltage to turn off the transfer transistor 120 may be applied to a gate of the transfer transistor 120. When the photo detecting device 110 accumulates the charges for a certain amount of time, the transfer signal Tx having a voltage to turn on the transfer transistor 120 may be applied to the gate of the transfer transistor 120.

The source follower transistor 130 may amplify a voltage of the floating diffusion FD, and the selection transistor 140 may selectively output the amplified voltage dependent on the selection signal Sx. According to the reset signal Rx, the reset transistor 150 may connect the floating diffusion FD and the second voltage V_2 or block the floating diffusion FD from the second voltage V_2 so that the voltage of the floating diffusion FD is set as a reset voltage that is close to the second voltage V_2. Accordingly, the pixel 100, which includes components to amplify the electric signals converted from the light absorbed by the photo detecting device 110, is referred to as an active pixel sensor (APS).

As illustrated in FIG. 3, the voltage of the floating diffusion FD and the first voltage V_1 may be respectively applied to a gate and a drain of the source follower transistor 130. Therefore, the source follower transistor 130 may output voltages according to the voltage of the floating diffusion FD by using the drain.

Referring to FIGS. 2 and 3, the first and second voltages V_1 and V_2 may be generated by the voltage supply circuit 1280 of the image sensor 1000, and both the first and second voltages V_1 and V_2 may be DC voltages. The second voltage V_2 is to reset the floating diffusion FD by using the reset transistor 150. Since the floating diffusion FD is reset when the transfer transistor 120 is turned off, a current may flow according to charges trapped in the floating diffusion FD that is not yet reset.

On the other hand, the first voltage V_1 is applied to the drain of the source follower transistor 130, and allows the source follower transistor 130 to operate in the saturation region. That is, a constant drain current may continuously flow between a source and the drain of the source follower transistor 130. Therefore, the voltage supply circuit 1280 may supply more current through a line that supplies the first voltage V_1 than a line that supplies the second voltage V_2.

As illustrated in the right side of FIG. 3, a gate voltage, a source voltage, and a drain voltage of the source follower transistor 130 that is included in the pixel 100 are respectively referred to as V_G, V_S, and V_D. The V_G, V_S, and V_D respectively indicate the gate, source, and drain voltages of the source follower transistor 130 from the ground voltage. Operations of the source follower transistor 130 will be described in detail with reference to FIGS. 4 and 5. The circuit diagram illustrated in FIG. 3 is merely an example. The exemplary embodiments of the present general inventive concept are not limited to the pixel 100 of FIG. 3 or the image sensor 1000 including the pixels 100 but may include, for example, various 3T, 4T, 5T and 6T active sensor pixel types.

Figure 4:
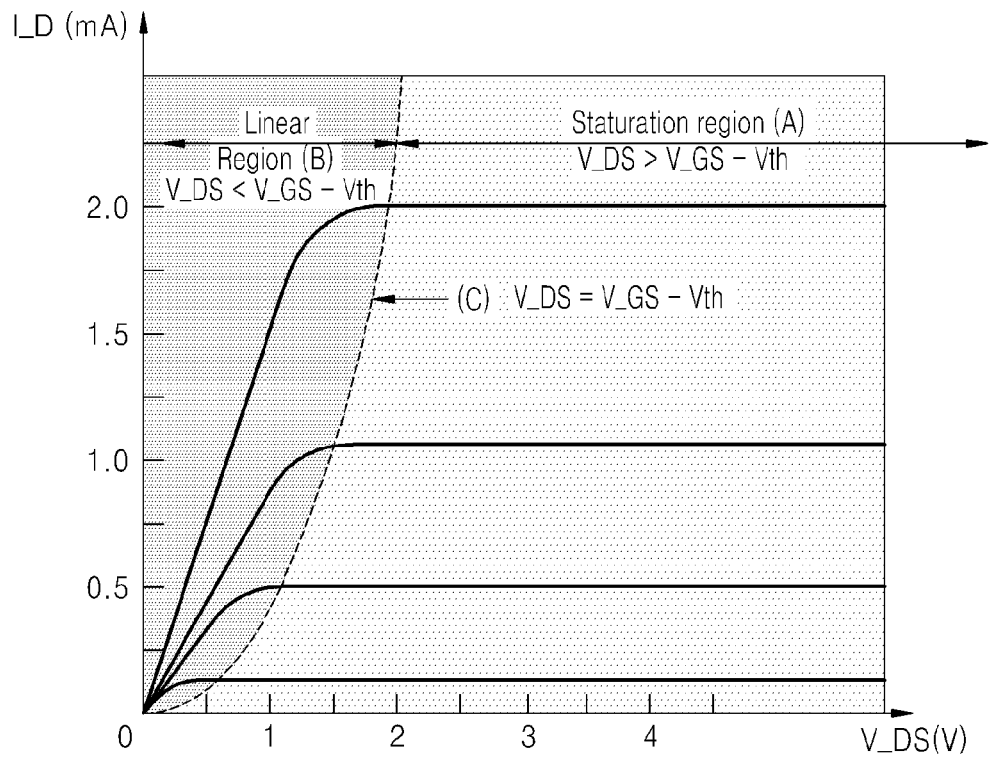
FIG. 4 is a graph illustrating a saturation region and a linear region of a metal oxide semiconductor (MOS) transistor according to an exemplary embodiment of the present general inventive concept.

FIG. 4 is a graph illustrating a saturation region A and a linear region B of an exemplary MOS transistor (e.g., source follower transistor 130). In FIG. 4, V_DS indicates a voltage between a drain and a source of the MOS transistor; V_GS indicates a voltage between a gate and the source of MOS transistor; Vth indicates a threshold voltage of the MOS transistor; and I_D indicates a drain current of the MOS transistor.

As illustrated in FIG. 4, the saturation region A may be defined as a region where a voltage value, i.e., the voltage V_GS between the gate and the source of the MOS transistor minus the threshold voltage Vth, is less than the voltage V_DS between the drain and source of the MOS transistor. Also, the linear region B may be defined as a region where the voltage value, i.e., the voltage V_GS between the gate and the source of the MOS transistor minus the threshold voltage Vth, is greater than the voltage V_DS between the drain and source of the MOS transistor. A boundary C between the saturation region A and the linear region B is indicated as a pinch-off point, where the voltage value, i.e., the voltage V_GS between the gate and the source of the MOS transistor minus the threshold voltage Vth, is equal to the voltage V_DS between the drain and source of the MOS transistor.

When Equation 1 below is satisfied, the MOS transistor may operate in the saturation region A. When the MOS transistor operates in the saturation region A, the drain current I_D may be defined as in Equation 2 below.

$$V\_DS > V\_GS - Vth \quad \text{[Equation 1]}$$

$$I\_D \propto (V\_GS - Vth)^2 \quad \text{[Equation 2]}$$

According to Equation 2, a magnitude of the drain current I_D in the saturation region A may be determined depending on the voltage V_GS between the gate and source of the MOS transistor. In other words, when the drain current I_D is constant in the saturation region A, the voltage V_GS between the gate and source of the MOS transistor may be constant. Therefore, a source voltage of the MOS transistor in the saturation region A may change according to a gate voltage, and such a MOS transistor is indicated as a source follower or a source follower transistor. In general, an impedance of the gate of the MOS transistor is relatively very high compared to an output impedance of the MOS transistor, such that the source follower may be used as an analog signal buffer that provides a high input impedance and a low output impedance.

As illustrated in FIG. 4, the lower the drain current I_D in the saturation region A, the lower the voltage V_DS between the drain and the source of the MOS transistor at the pinch-off point. In order to maintain the voltage V_GS to be constant between the gate and the source of the MOS transistor, the source follower may require the drain current I_D to be constant. Therefore, in order to reduce power consumption of the source follower, it is necessary to reduce a voltage applied to the drain of the source follower. However, since the source follower operates in the saturation region A, there may be a limitation in reducing the voltage applied to the drain of the source follower. Thus, the threshold voltage Vth of the source follower may be increased in order to reduce the voltage applied to the drain of the source follower. For example, boron (B) may be injected into a shallow region of a p-type body (substrate) of the NMOS transistor so that the threshold value Vth of the source follower is increased.

Referring to FIGS. 3 and 4, the source follower transistor 130 of the pixel 100 may operate in the saturation region A, and the source voltage V_S may depend on the gate voltage V_G. A gate of the source follower transistor 130 is connected to the floating diffusion FD, and the voltage of the floating diffusion FD is determined depending on the charge accumulated by the photo diode 110. Thus, the source follower transistor 130 may amplify a voltage that is dependent on the charges accumulated by the photo diode 110, and output the amplified voltage through the source. Also, since power consumption of the source follower transistor 130 is reduced as the drain voltage V_D of the source follower transistor 130 is reduced, the voltage supply circuit 1280 that applies the first voltage V_1 to the drain of the source follower transistor 130 may reduce the first voltage V_1 so as to reduce the power consumption.

Figure 5:
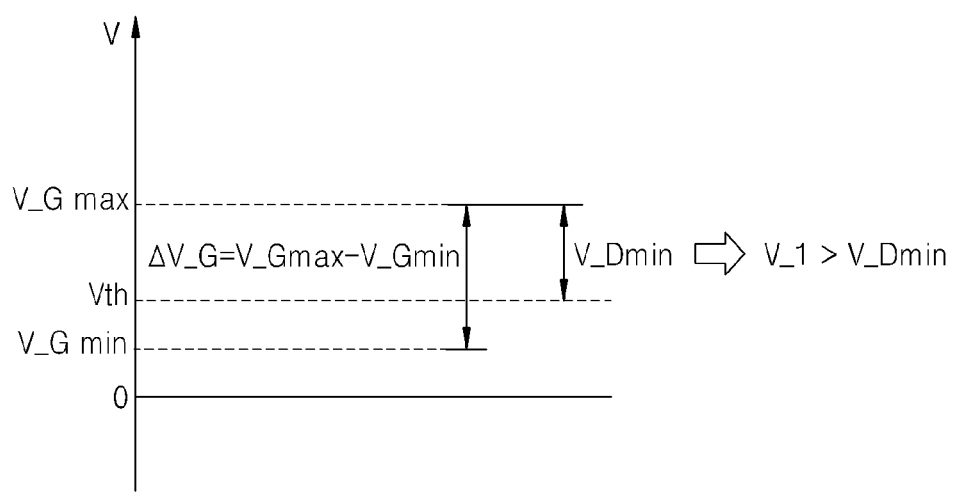
FIG. 5 is a graph illustrating properties of a drain voltage of the source follower transistor, according to an exemplary embodiment of the present general inventive concept.

FIG. 5 is a graph illustrating properties of the drain voltage V_D of the source follower transistor 130, according to an exemplary embodiment of the present general inventive concept. Referring to FIGS. 3 and 4, the voltage dependent on the charges accumulated by the photo diode 110 may be applied to the gate of the source follower transistor 130. A maximum and minimum amount of the charges accumulated by the photo diode 110 may depend on the intensity of the absorbed light. Therefore, the gate voltage V_G of the source follower transistor 130 may have a maximum value V_Gmax and a minimum value V_Gmin, and a voltage range ΔV_G may be defined as ΔV_G=V_Gmax−V_Gmin.

The source follower transistor 130 may satisfy Equation 1 so as to operate in the saturation region A. The Equation 1 may be shown as Equation 3 below by using the gate voltage V_G and the drain voltage V_D of the source follower transistor 130.

$$Vth > V\_G - V\_D \qquad \text{[Equation 3]}$$

Since the range ΔV_G of the gate voltage V_G is defined by the maximum and minimum amount of the charges accumulated by the photo diode 110, the drain voltage V_D may have a minimum drain voltage V_Dmin, as illustrated in FIG. 5. That is, the minimum drain voltage V_Dmin may indicate a minimum voltage that may be applied to the drain so that the source follower transistor 130 of the pixel 100 is in the saturation region A. Therefore, referring to FIG. 3, the first voltage V_1 that is applied to the drain of the source follower transistor 130 may be greater than the minimum drain voltage V_Dmin (V_1>V_Dmin). The voltage supply circuit 1280 according to an exemplary embodiment of the present general inventive concept may generate and output the first voltage V_1 that is greater than the minimum drain voltage V_Dmin.

The graph illustrated in FIG. 5 illustrates that as the threshold voltage Vth of the source follower transistor 130 increases, the minimum drain voltage V_Dmin decreases. The power consumption of the source follower transistor 130 may be reduced as the minimum drain voltage V_Dmin is reduced, and the minimum drain voltage V_Dmin may be further reduced as the threshold voltage Vth of the source follower transistor 130 is increased.

Figure 6:
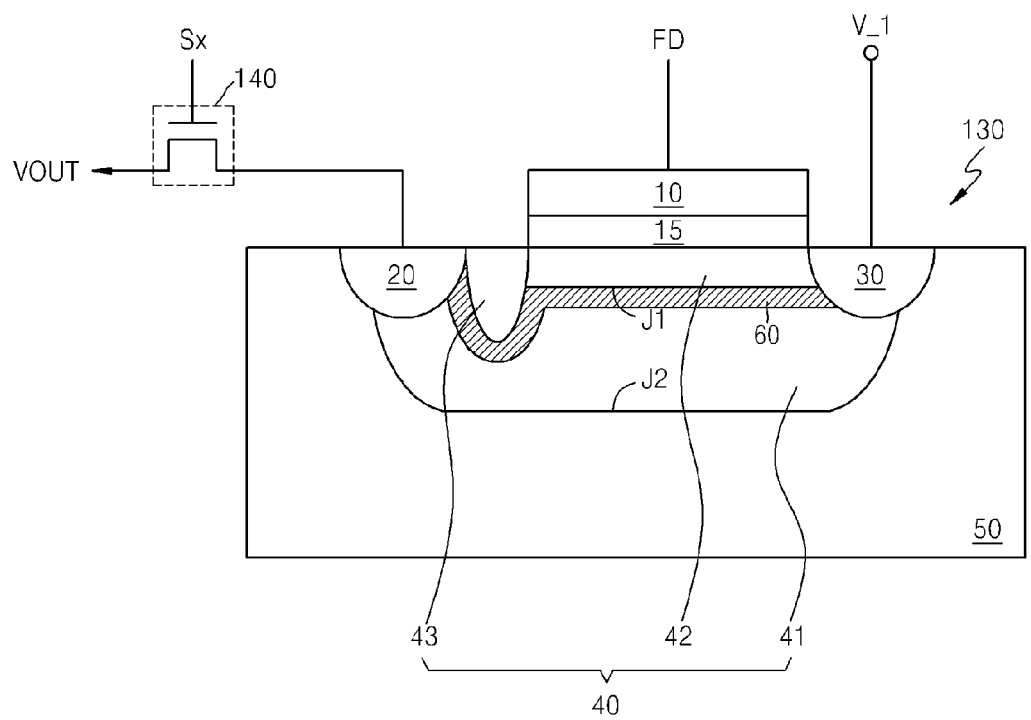
FIG. 6 is a cross-sectional view illustrating the structure of the source follower transistor, according to an exemplary embodiment of the present general inventive concept.

FIG. 6 illustrates the structure of the source follower transistor 130, according to an exemplary embodiment of the present general inventive concept. As illustrated in FIG. 6, the source follower transistor 130 may include a gate 10, a gate insulating layer 15, a source 20, a drain 30, a channel structure 40, and a body 50. The gate 10 and the source 20 may be respectively connected to the floating diffusion FD and the selection transistor 140. The first voltage V_1 may be applied to the drain 30. According to an exemplary embodiment of the present general inventive concept, the source 20 and the drain 30 may include a first conductive type impurity, and the body 50 may include a second conductive type impurity. For example, the first conductive type may be n-type, and the second conductive type may be p-type. The respective impurities may be introduced by doping a body or substrate of the source follower transistor 130. The gate insulating layer 15 may include an insulator to insulate the gate 10 and the channel structure 40.

As illustrated in FIG. 6, ends of the channel structure 40 may be connected to the source 20 and the drain 30. The channel structure 40 may include a first semiconductor layer 41, a second semiconductor layer 42, and a blocking structure 43. The ends of the first semiconductor layer 41 may be connected to the source 20 and the drain 30, and a channel 60 through which carriers move may be formed from the source 20 to the drain 30. The second semiconductor layer 42 may be formed between the first semiconductor layer 41 and the gate insulating layer 15, and may increase the threshold voltage Vth of the source follower transistor 130 by including the second conductive type impurity. The blocking structure 43 may be formed between the source 20 and the second semiconductor layer 42, and may block the carriers from moving from the source 20 to the second semiconductor layer 42.

According to an exemplary embodiment of the present general inventive concept, the first semiconductor layer 41 may include the first conductive type impurity, and the second semiconductor layer 42 may include the second conductive type impurity. A surface of the first semiconductor layer 41 may form a first PN junction J1 with the second semiconductor layer 42, and another surface of the first semiconductor layer 41 may form a second PN junction J2 with the body 50. The first semiconductor layer 41 has a thickness and a first conductive type carrier concentration that allows the first semiconductor layer 41 to be fully depleted by the first and second PN junctions J1 and J2. The second semiconductor layer 42 has a thickness and a second conductive type carrier concentration that allows the second semiconductor layer 42 to be fully depleted by the first PN junction J1.

The channel 60 in the MOS transistor (e.g., source follower transistor 130), through which the carriers move from the source 20 to the drain 30, is formed based on the voltage applied to the gate 10. The channel 60 may be formed directly below the gate insulating layer 15. A region in which the channel is formed may contact the gate insulating layer 15, and may have more defects as the region is closer to the gate insulating layer 15. The defects distributed near a surface that contacts the gate insulating layer 15 may affect the carriers that pass through the channel, and cause noise, such as random noise or 1/f noise, to signals (voltages or currents) that are output via the transistor.

In order to increase the threshold voltage Vth of the MOS transistor, an impurity injection method may be used in the region in which the channel 60 is formed. For example, the NMOS transistor of which the threshold voltage Vth is increased may be called as an enhancement device or a normally-off device. As illustrated in FIG. 5, in order to reduce the power consumed by the source follower transistor 130 of the pixels 100, the impurity injection method may be used to increase the threshold voltage Vth of the source follower transistor 130. However, when the threshold voltage Vth is increased, an electric field between the gate of the source follower transistor 130 and the channel 60 may be stronger. Therefore, there may be an increase in the amount of carriers that pass through a portion of the channel that is closer to the gate insulating layer 15, and the increase may cause more noise.

In the source follower transistor 130 according to an exemplary embodiment of the present general inventive concept, the threshold voltage Vth may be increased so as to reduce the first voltage V_1 that is applied to the drain 30, and simultaneously, the channel 60, through which the carriers pass, may be formed in the portion that is spaced apart from the gate insulating layer 15 by the first depth T, as illustrated in FIG. 1. For example, the first depth T may be determined depending on the respective thicknesses and impurity concentrations of the first and second semiconductor layers 41 and 42. Thus, the power consumed by the source follower transistor 130 may be reduced, and noise included in the source voltage output by the source follower transistor 130 may be relatively reduced.

Figure 7:
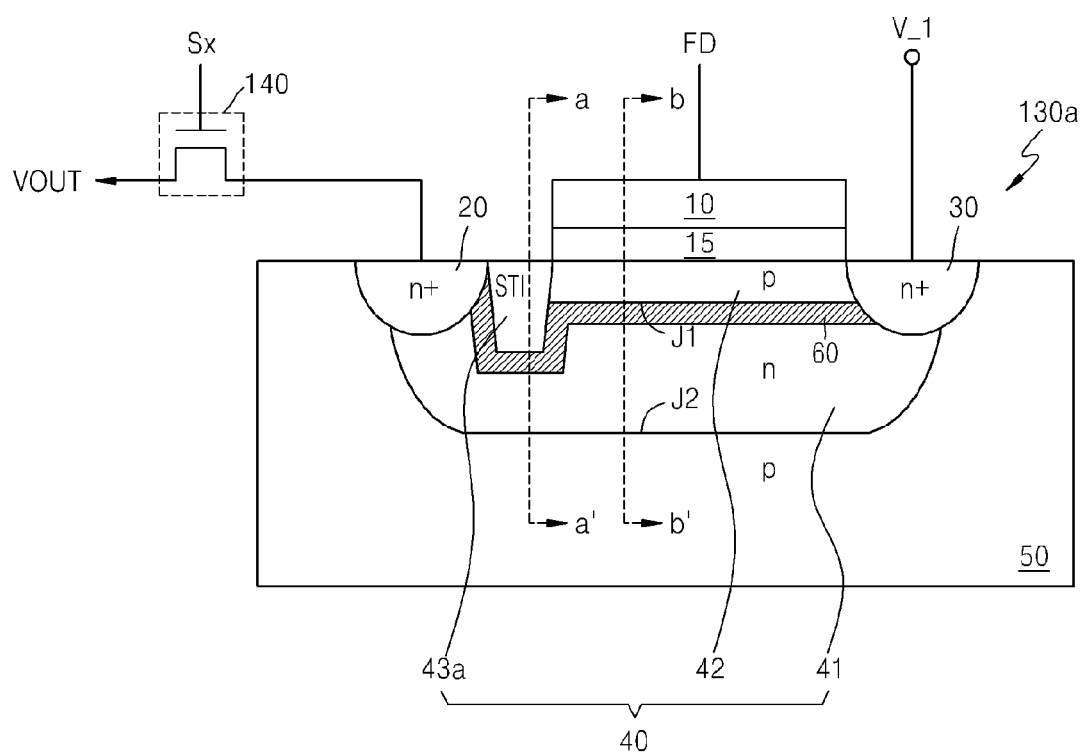
FIG. 7 is a cross-sectional view schematically illustrating a structure of a source follower transistor, according to an exemplary embodiment of the present general inventive concept.

FIG. 7 illustrates a structure of a source follower transistor 130a, according to an exemplary embodiment of the present general inventive concept. Like the source follower transistor 130 of FIG. 6, the first conductive type is n-type, and the second conductive type is p-type in the source follower transistor 130a of FIG. 7. The source follower transistor 130a of FIG. 7 is an NMOS transistor in which an n-type channel is formed, and electrons may move through a channel 60 that is formed in the first semiconductor layer 41 from the source 20 to the drain 30. Descriptions of features that are identical to those of FIG. 6 will be omitted.

According to an exemplary embodiment of the present general inventive concept, as illustrated in FIG. 7, the blocking structure 43 of FIG. 6 may be a shallow trench isolation STI 43a. The shallow trench isolation STI 43a may be formed by dry-etching a trench and filling the trench by using an insulator or the like. For example, the trench may be formed by reactive ion etching (RIE), and a depth of the trench may range from about 1000 Å to about 4000 Å. When the trench is formed, a dielectric layer, such as SiO$_2$, may be deposited by using a low pressure chemical vapor deposition (LPCVD) method, and thus, the trench may be filled. Then, in order to planarize the trench, a chemical mechanical planarization (CMP) process may be executed.

The shallow trench isolation STI 43a may block the electrons from moving from the source 20 to the second semiconductor layer 42 that is p-type. The shallow trench isolation STI 43a may block the electrons from directly moving from the source 20 to the second semiconductor layer 42 so as to prevent the channel 60, which is a passage for the electrons, from being formed in the second semiconductor layer 42. Therefore, it is possible to minimize and/or prevent the channel 60 from being formed near the gate insulating layer 15 that is vulnerable to noise.

Figure 8A:
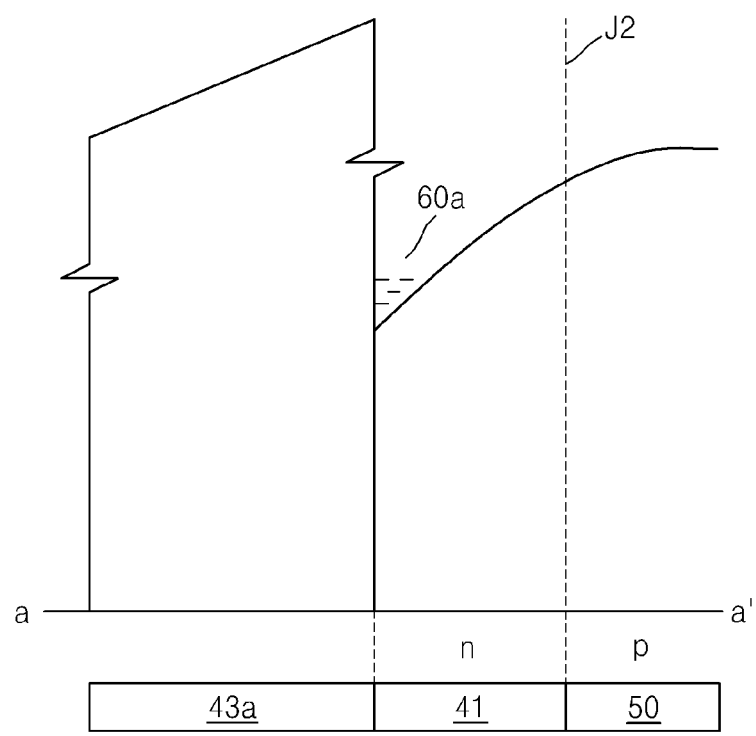
FIGS. 8A and 8B are band diagrams illustrating an energy band at different points of the source follower transistor of FIG. 7 along a vertical direction.
Figure 8B:
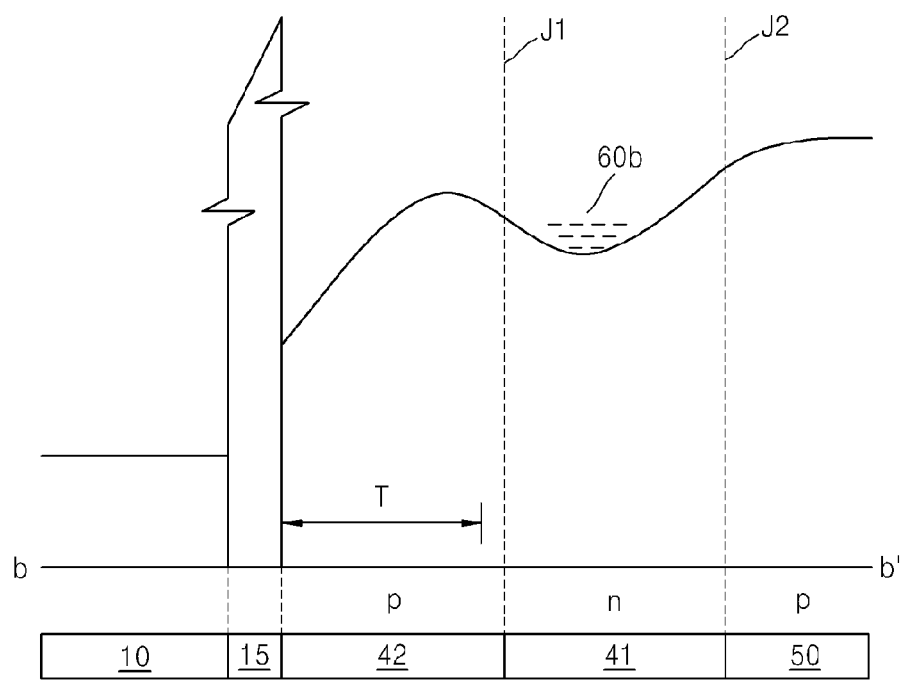

FIGS. 8A and 8B are band diagrams illustrating an energy band at different points of the source follower transistor 130a of FIG. 7 along a vertical direction. Specifically, FIG. 8A is the band diagram that illustrates the energy band along line a-a'; FIG. 8B is the band diagram that illustrates the energy band along line b-b'. FIGS. 8A and 8B not only illustrate the energy band, but channels 60a and 60b through which the carriers move.

FIG. 8A illustrates an expected energy band as carriers sequentially pass through the shallow trench isolation STI 43a, the first semiconductor layer 41, and the body 50 of the source follower transistor 130a of FIG. 7. As illustrated in FIG. 8A, due to the second PN junction J2, an energy band in the first semiconductor layer 41 may be downwardly curved around a surface that contacts the shallow trench isolation STI 43a. Therefore, the channel 60a through which the electrons move may be formed in the first semiconductor layer 41.

FIG. 8B illustrates an expected energy band as carriers sequentially pass through the gate 10, the gate insulating layer 15, the first semiconductor layer 41, the second semiconductor layer 42, and the body 50 of the source follower transistor 130a of FIG. 7. As illustrated in FIG. 8B, due to the voltage applied to the gate 10 of the source follower transistor 130a, an energy band in the second semiconductor layer 42 may be downwardly curved around a surface that contacts the gate insulating layer 15. Also, due to the first and second PN junctions J1 and J2, the energy band in the first semiconductor layer 41 may be concave.

As illustrated in FIG. 8A, due to the shallow trench isolation STI 43a, the electrons may not move from the source 20 to the second semiconductor layer 42, but may move via the channel 60a that is formed in the first semiconductor layer 41 located under the shallow trench isolation STI 43a. Therefore, as illustrated in FIG. 8B, the channel 60b may not be formed in a portion of the second semiconductor layer 42, which is near the gate insulating layer 15 and the energy band falls, but may instead be formed in the first semiconductor layer 41. The channel 60b formed in the first semiconductor layer 41 may be spaced apart from the gate insulating layer 15 by the first depth T that may range from, for example, about 300 Å to about 2000 Å or more.

Figure 9:
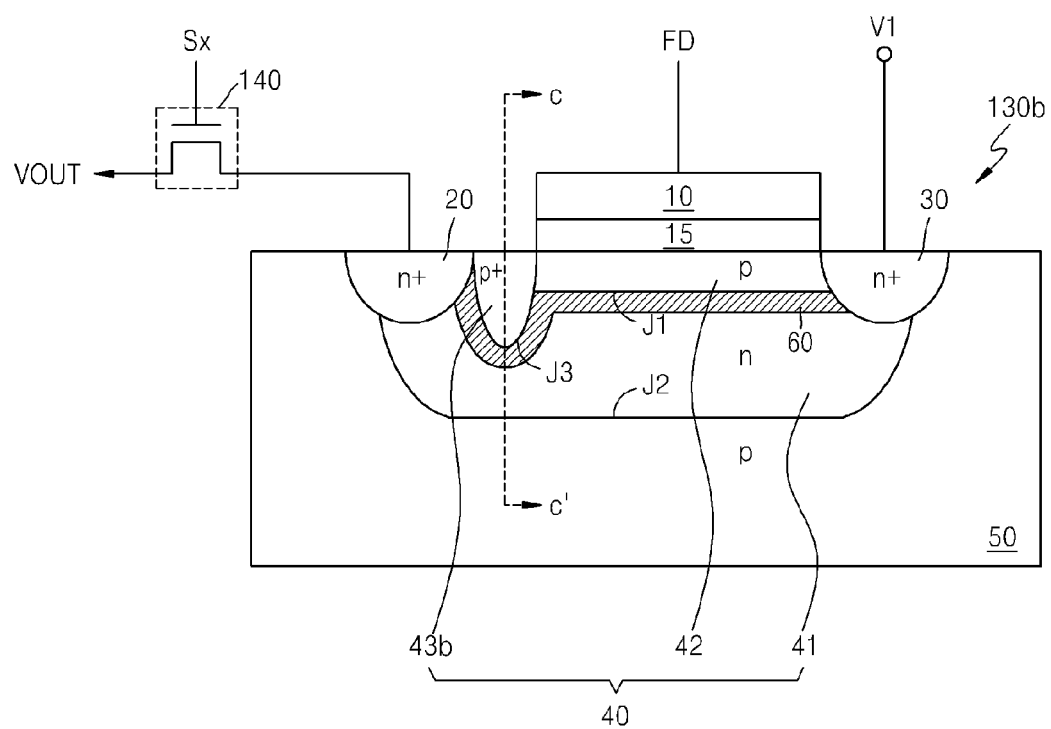
FIG. 9 is a cross-sectional view schematically illustrating a structure of a source follower transistor, according to an exemplary embodiment of the present general inventive concept.

FIG. 9 illustrates a structure of a source follower transistor 130b, according to an exemplary embodiment of the present general inventive concept. Like the source follower transistor 130a of FIG. 7, the first conductive type is n-type, and the second conductive type is p-type in the source follower transistor 130b of FIG. 9. Like the source follower transistor 130a of FIG. 6, the source follower transistor 130b is an NMOS transistor in which an n-type channel is formed, and the electrons may move through a channel 60 that is formed in the first semiconductor layer 41 from the source 20 to the drain 30. Descriptions of features that are identical to those of FIGS. 6 and 7 will be omitted.

According to an exemplary embodiment of the present general inventive concept, as illustrated in FIG. 9, the blocking structure 43 of FIG. 6 may be a p-type blocking structure 43b that includes a p-type (i.e., second conductive type) impurity. The p-type blocking structure 43b may be formed by diffusion, injection, growing, or the like, and may include the p-type (i.e., second conductive type) impurity having a higher concentration than that of the second semiconductor layer 42. The p-type blocking structure 43b may block electrons from moving from the source 20 to the semiconductor layer 42.

Figure 10:
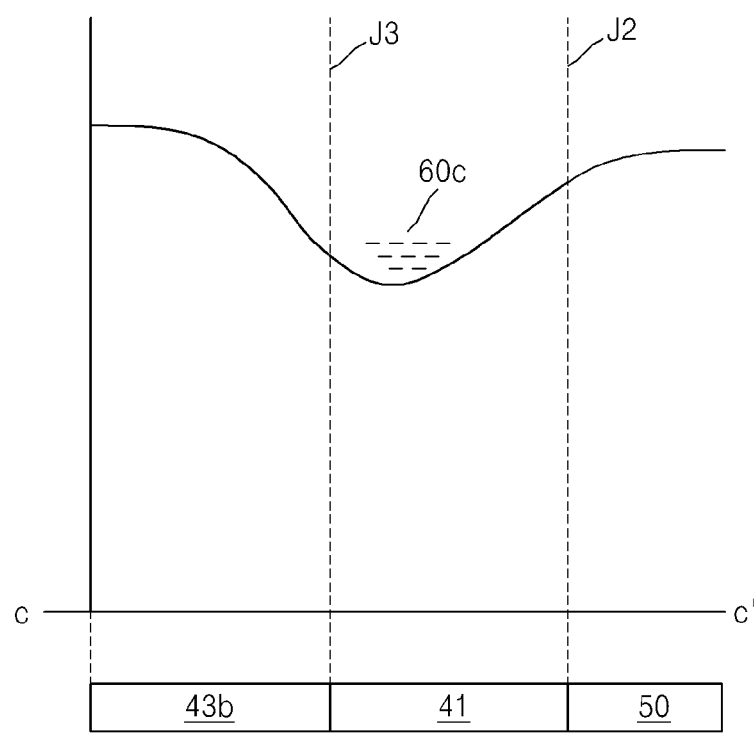
FIG. 10 is a band diagram illustrating an energy band at a point of the source follower transistor of FIG. 9 along a vertical direction.

FIG. 10 is a band diagram illustrating an energy band at a point of the source follower transistor 130b of FIG. 9 along a vertical direction. Specifically, FIG. 10 is the band diagram that illustrates an expected energy band as carriers sequentially pass through the p-type blocking structure 43b, the first semiconductor layer 41, and the body 50, along line c-c' of FIG. 9. FIG. 10 also illustrates a channel 60c through which the carriers move.

As illustrated in FIG. 10, since the p-type blocking structure 43b includes the p-type impurity having a relatively high concentration compared to the second semiconductor layer 42 and the body 50, the energy band in the p-type blocking structure 43b may not be downwardly curved, unlike the second semiconductor layer 42 illustrated in FIG. 8B. Therefore, the channel 60c may not be formed in the p-type blocking structure 43b, but may be formed in the first semiconductor layer 41 located under the p-type blocking structure 43b. That is, due to a third PN junction J3 between the first semiconductor layer 41 and the p-type blocking structure 43b and the second PN junction J2, in the first semiconductor layer 41, the energy band may be convex in a downward direction, and the channel 60c may be formed.

Figure 11:
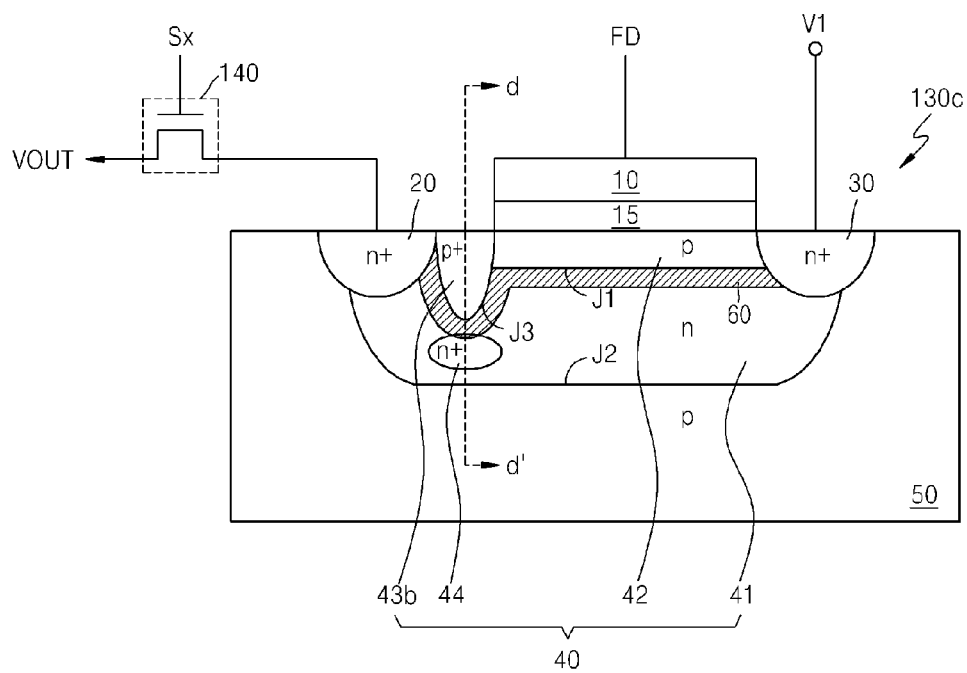
FIG. 11 is a cross-sectional view schematically illustrating a structure of a source follower transistor, according to an exemplary embodiment of the present general inventive concept.

FIG. 11 illustrates a structure of a source follower transistor 130c, according to an exemplary embodiment of the present general inventive concept. Like the source follower transistor 130b of FIG. 9, the source follower transistor 130c of FIG. 11 is an NMOS transistor in which an n-type channel is formed, such that the electrons may move through a channel 60 that is formed in the first semiconductor layer 41 from the source 20 to the drain 30. Descriptions of features that are identical to those of FIG. 9 and other previous drawings will be omitted.

According to an exemplary embodiment of the present general inventive concept, as illustrated in FIG. 11, the source follower transistor 130c may include a pass-through region 44 in the first semiconductor layer 41 that is located under the p-type blocking structure 43b. The pass-through region 44 is a first conductive type and includes an n-type impurity, and the n-type carrier concentration of the pass-through region 44 may be higher than that of the first semiconductor layer 41. The pass-through region 44 may be formed by injection, or the like. The channel may be formed near the pass-through region 44. The pass-through region 44 may allow the electrons to flow better in the first semiconductor layer 41 located under the p-type blocking structure 43b.

Figure 12:
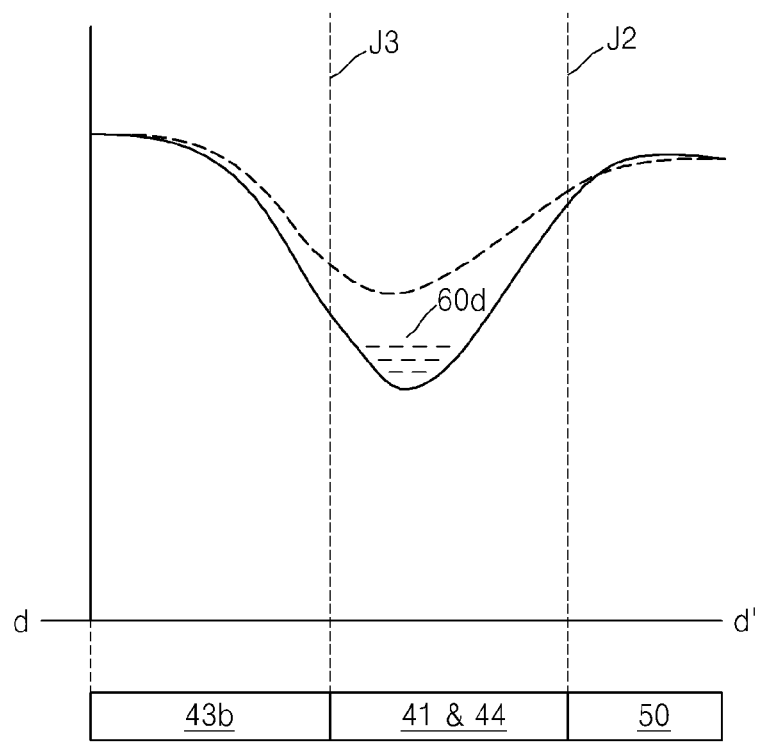
FIG. 12 is a band diagram illustrating an energy band at a point of the source follower transistor of FIG. 11 along a vertical direction.

FIG. 12 is a band diagram illustrating an energy band at a point of the source follower transistor 130c of FIG. 11 along a vertical direction. Specifically, FIG. 12 is the band diagram that illustrates an expected energy band along a line d-d'. For comparison with FIG. 10, the energy band of FIG. 10 is illustrated as dashed lines in FIG. 12.

As illustrated in FIG. 12, since the first conductive type carrier concentration in the pass-through region 44 is high compared to the first semiconductor layer 41, the energy band in the first semiconductor layer 41 and the pass-through region 44 may be located lower than the energy band of FIG. 10. Since an inclination of the energy band that is formed due to the third PN junction J3 with the p-type blocking structure 43b may increase more, a channel 60d may be more easily formed in the first semiconductor layer 41 and the pass-through region 44.

Figure 13:
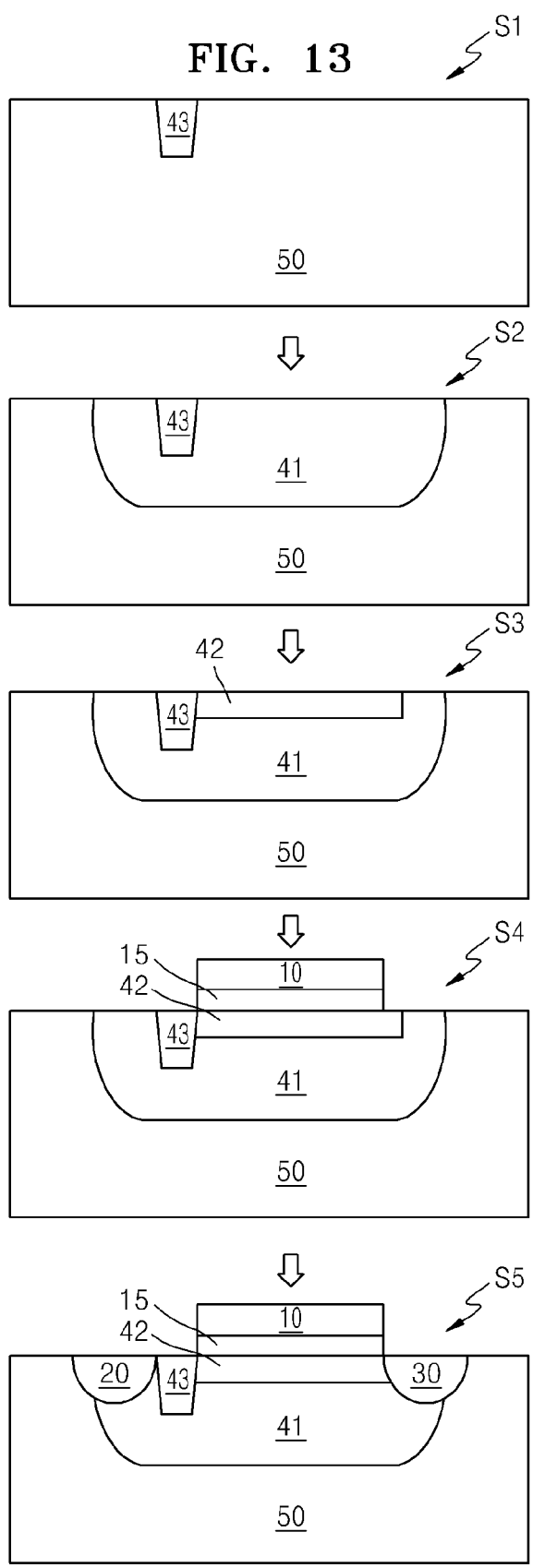
FIG. 13 is a view illustrating a method of manufacturing the source follower transistor, according to an exemplary embodiment of the present general inventive concept.

FIG. 13 illustrates a method of manufacturing the source follower transistor 130, according to an exemplary embodiment of the present general inventive concept. Specifically, FIG. 13 illustrates structures in which each process is executed according to an exemplary manufacturing method. FIG. 13 is only an example of the method of manufacturing the source follower transistor 130. The method of manufacturing the source follower transistor 130 according to the exemplary embodiments of the present general inventive concept is not limited to the method illustrated in FIG. 13.

As illustrated in FIG. 13, the blocking structure 43 may be formed in the body 50 that is the second conductive type (operation S1). For example, the blocking structure 43 may be a shallow trench isolation STI. A depth of the shallow trench isolation STI may range from about 1000 Å to about 4000 Å. The shallow trench isolation STI may be formed by dry-etching, and the inside thereof may be filled by using an insulator. The first semiconductor layer 41 that is the first conductive type may be formed in the body 50 (or a substrate) that is the second conductive type by diffusion or injection (operation S2). For example, a depth of the first semiconductor layer 41 may range from about 2000 Å to about 8000 Å. According to the exemplary embodiments of the present general inventive concept, the blocking structure 43 and the first semiconductor layer 41 may be formed in the opposite order.

After the first semiconductor layer 41 is formed, the second semiconductor layer 42 that is the second conductive type may be formed in the first semiconductor layer 41 by diffusion or injection (operation S3). For example, a depth of the second semiconductor layer 42 may range from about 300 Å to about 2000 Å. The gate insulating layer 15 and the gate 10 may be formed on the second semiconductor layer 42 (operation S4), and the source 20 and the drain 30 that are the first conductive type may be formed in both ends of the first semiconductor layer 41 (operation S5).

Figure 14:
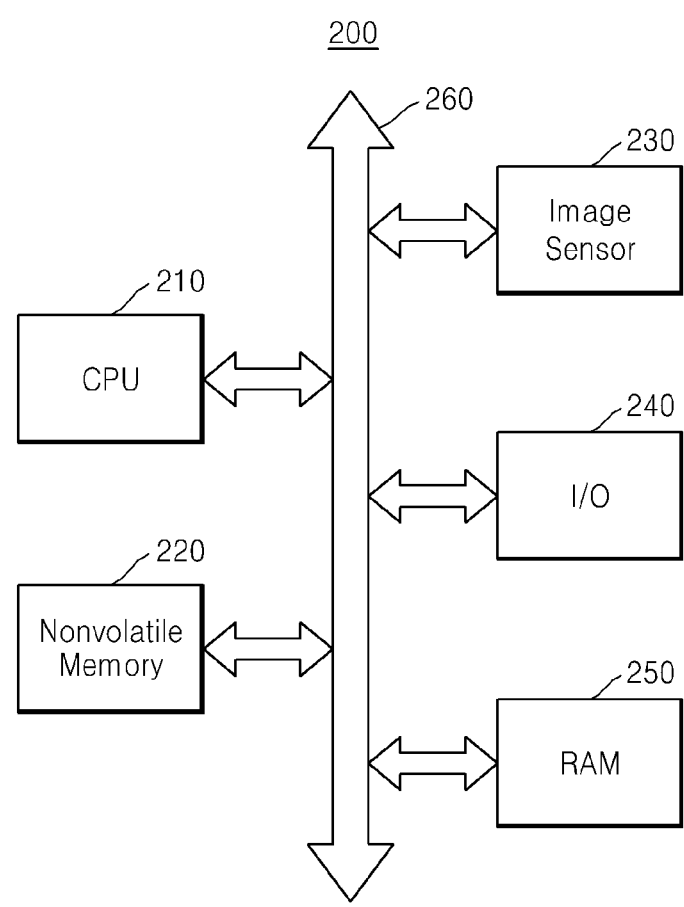
FIG. 14 is a block diagram illustrating a system that includes the image sensor, according to an exemplary embodiment of the present general inventive concept.

FIG. 14 illustrates a system 200 that includes an image sensor 230, according to an exemplary embodiment of the present general inventive concept. The system 200 may be, for example, a computing system which requires image data, a camera system, a scanner, a car navigator, a video phone, a security system, or a movement detection system.

As illustrated in FIG. 14, the system 200 may include a central processing unit (CPU; or processor) 210, a non-volatile memory 220, an image sensor 230, an I/O unit 240, and an RAM 250. The CPU 210 may communicate with the non-volatile memory 220, the image sensor 230, the I/O unit 240, and the RAM 250 via a bus 260. The CPU 210 may receive, via the bus 260, a user's command that is input in the I/O unit 240, and control the system 200. Also, the CPU 210 may process data output by the image sensor 230, and function as an image processor to generate image data. The image data that is generated by the CPU 210 may be stored in the non-volatile memory 220, and be output to the outside of the system 200 via the I/O unit 240. The RAM 250 may function as a data memory of the CPU 210.

The image sensor 230 may be implemented as an independent semiconductor chip, or as a single semiconductor chip by being combined with the CPU 210. The image sensor 230 may include the pixel 100 including the source follower transistor 130, and the pixel array 1100 including the pixels 100, which are described above according to the exemplary embodiments of the present general inventive concept. Referring to FIG. 6, the source follower transistor 130 may include the channel structure 40, and the channel structure 40 may include the first semiconductor layer 41, the second semiconductor layer 42, and the blocking structure 43. The carriers may move from the source 20 to the drain 30 of the source follower transistor 130 via the channel formed in the first semiconductor layer 41.

Figure 15:
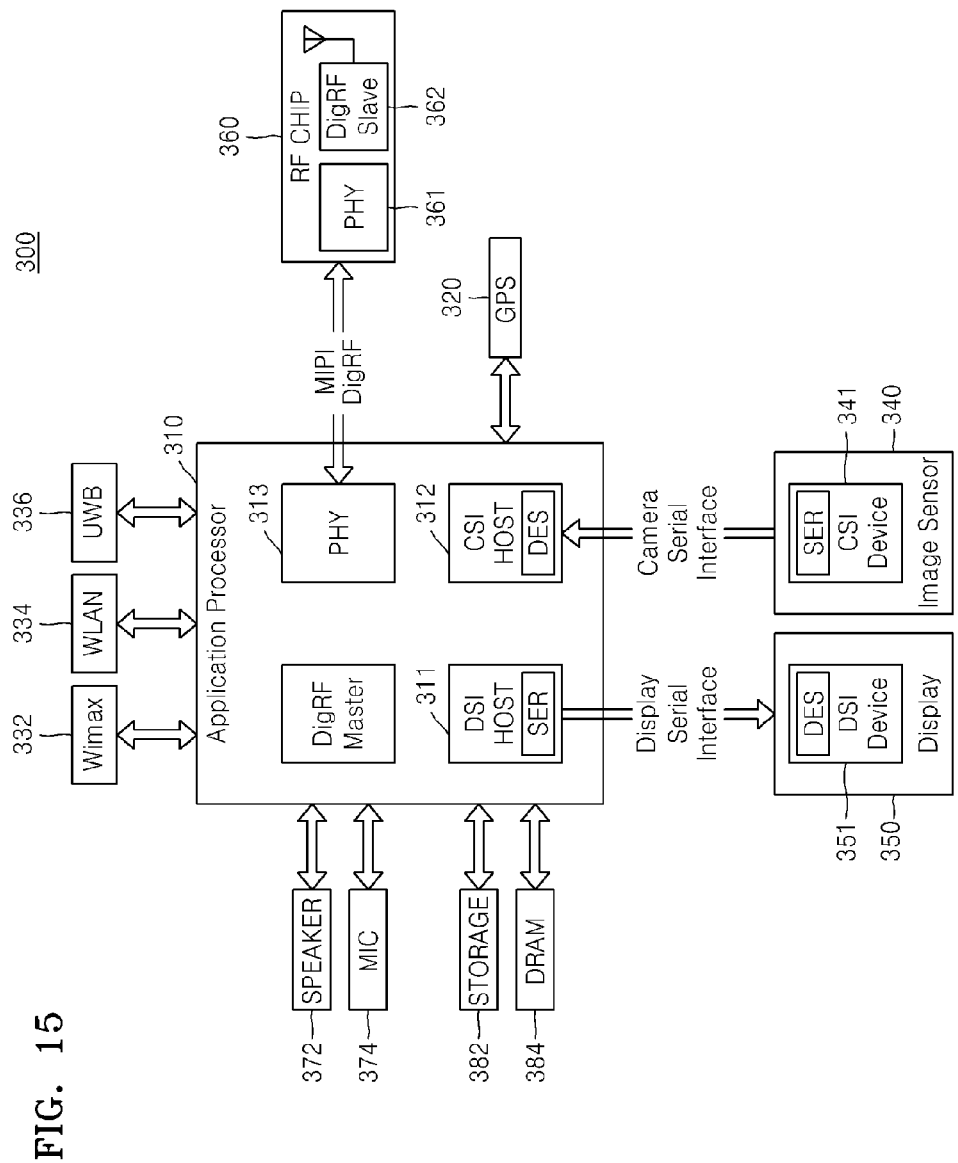
FIG. 15 is a view illustrating an electronic system and an interface that includes the image sensor, according to an exemplary embodiment of the present general inventive concept.

FIG. 15 illustrates an electronic system 300 and an interface that includes the image sensor, according to an exemplary embodiment of the present general inventive concept. As illustrated in FIG. 15, the electronic system 300 may be implemented as a data processor to use or support mobile industry processor interface (MIPI), such as mobile phones, personal digital assistants (PDAs), portable media players (PMPs), or smartphones. The electronic system 300 may include an application processor 310, an image sensor 340, and a display 350. The image sensor 230 may include the pixel 100 including the source follower transistor 130, and the pixel array 1100 including the pixels 100, which are described above according to the exemplary embodiments of the present general inventive concept.

A camera serial interface (CSI) host 312, provided in the application processor 310, may perform serial communication with a CSI device 341 of the image sensor 340 via CSI. In this case, for example, an optical deserializer may be provided in the CSI host 312 and an optical serializer may be provided in the CSI device 341.

A display serial interface (DSI) host 311, provided in the application processor 310, may perform serial communication with a DSI device 351 of the display 350 via DSI. In this case, for example, an optical serializer may be provided in the DSI host 311; and optical deserializer may be provided in the DSI device 351.

The electronic system 300 may further include a radio frequency (RF) chip 360 to communicate with the application processor 310. The PHY 313 of the electronic system 300 and the PHY 361 and DigRF slave 362 of the RF chip 360 may transmit and receive data, for example, according to MIPI DigRF.

The electronic system 300 may further include a GPS 320, a storage unit 382, a DRAM 384, a speaker 372, and a microphone 374. The electronic system 300 may communicate by using worldwide interoperability for microwave access (WiMax) 332, wireless local area network (WLAN) 334, and ultra-wideband (UWB) 336.

While the present general inventive concept has been particularly shown and described with reference to a few embodiments thereof, it will be understood that various changes in form and details may be made therein without departing from the principles and spirit of the general inventive concept, the scope of which is defined in the following claims and their equivalents.

What is claimed is:

1. An image sensor comprising a source follower transistor comprising:
    a gate to which a voltage dependent on charges accumulated in a photo detecting device is applied;
    a gate insulating layer formed under the gate;
    a source and a drain, which are a first conductive type;
    a first semiconductor layer that is the first conductive type, having ends connected to the source and the drain, and having a channel through which carriers move from the source to the drain formed therein;
    a second semiconductor layer, that is a second conductive type that is different from the first conductive type, and is formed between the gate insulating layer and the first semiconductor layer; and
    a blocking structure that blocks the carriers from moving between the source and the second semiconductor layer,
    wherein the image sensor further comprises a body that is the second conductive type,
    wherein a surface of the first semiconductor layer forms a first PN junction with the second semiconductor layer, and another surface of the first semiconductor layer forms a second PN junction with the body,
    wherein the first semiconductor layer has a first conductive type carrier concentration that allows the first semiconductor layer to be fully depleted by the first and second PN junctions, and
    wherein the second semiconductor layer has a second conductive type carrier concentration that allows the second semiconductor layer to be fully depleted by the first PN junction.

2. The image sensor of claim 1, wherein the blocking structure is a shallow trench isolation (STI) that is formed between the source and the second semiconductor layer, and
    wherein the STI includes an insulating material.

3. The image sensor of claim 1, wherein the blocking structure is formed between the source and the second semiconductor layer, and is the second conductive type, and
    wherein a second conductive type impurity concentration of the blocking structure is higher than a second conductive type impurity concentration of the second conductive layer.

4. The image sensor of claim 1, wherein the source follower transistor further comprises a pass-through region that is the first conductive type, and is formed in the first semiconductor layer under the blocking structure, and
    wherein a first conductive type impurity concentration of the pass-through region is higher than a first conductive type impurity concentration of the first semiconductor layer.

5. The image sensor of claim 1, wherein the first conductive type is n-type, and
    wherein the second conductive type is p-type.

6. The image sensor of claim 1, further comprising a voltage supply circuit applying a first voltage to the drain so that the voltage between the gate and the drain is lower than a threshold voltage of the source follower transistor.

7. The image sensor of claim 6, wherein the first voltage is a direct current (DC) voltage.

8. An image sensor comprising a source follower transistor comprising:
    a gate to which a voltage dependent on charges accumulated in a photo detecting device is applied;
    a gate insulating layer formed under the gate;
    a source and a drain, which are a first conductive type; and
    a channel structure having ends connected to the source and the drain, and which contacts the gate insulating layer,
    wherein carriers move from the source to the drain through a channel that is formed in a portion of the channel structure that is spaced apart from the gate insulating layer by a first depth or more,
    wherein the channel structure comprises a first semiconductor layer that is the first conductive type, having ends connected to the source and the drain, and a second semiconductor layer, that is a second conductive type that is different from the first conductive type, and is formed between the gate insulating layer and the first semiconductor layer,
    wherein the carriers move from the source to the drain through the first semiconductor layer, and
    wherein the channel structure further comprises a blocking structure that blocks the carriers from moving between the source and the second semiconductor layer,
    wherein the image sensor further comprises a body that is the second conductive type,
    wherein a surface of the first semiconductor layer forms a first PN junction with the second semiconductor layer, and another surface of the first semiconductor layer forms a second PN junction with the body,
    wherein the first semiconductor layer has a first conductive type carrier concentration that allows the first semiconductor layer to be fully depleted by the first and second PN junctions, and
    wherein the second semiconductor layer has a second conductive type carrier concentration that allows the second semiconductor layer to be fully depleted by the first PN junction.

9. The image sensor of claim 8, further comprising a voltage supply circuit applying a first voltage to the drain so that the voltage between the gate and the drain is lower than a threshold voltage of the source follower transistor.

10. The image sensor of claim 9, further comprising a pixel array including a plurality of pixels,
    wherein each of the plurality of pixels includes the source follower transistor,
    wherein the drain of the source follower transistor included in each of the plurality of pixels are wired to each other, and
    wherein the first voltage is a DC voltage.

* * * * *